United States Patent
Sin Yan Too

(10) Patent No.: US 7,203,065 B1
(45) Date of Patent: Apr. 10, 2007

(54) HEATSINK ASSEMBLY

(75) Inventor: Thierry Sin Yan Too, San Jose, CA (US)

(73) Assignee: Ciena Corporation, Linthicum, MD (US)

( * ) Notice: Subject to any disclaimer, the term of this patent is extended or adjusted under 35 U.S.C. 154(b) by 346 days.

(21) Appl. No.: 10/876,473

(22) Filed: Jun. 28, 2004

Related U.S. Application Data

(60) Provisional application No. 60/524,040, filed on Nov. 24, 2003.

(51) Int. Cl.
*H05K 7/20* (2006.01)

(52) U.S. Cl. ............... 361/704; 361/709; 361/719; 165/80.3; 165/104.33

(58) Field of Classification Search ............ 361/690, 361/704, 707, 710, 717–719; 257/706–707, 257/713, 718–719; 165/80.3, 104.33
See application file for complete search history.

(56) References Cited

U.S. PATENT DOCUMENTS

| | | | |
|---|---|---|---|
| 4,607,685 A * | 8/1986 | Mitchell, Jr. ............. | 165/80.3 |
| 5,313,099 A * | 5/1994 | Tata et al. .................. | 257/717 |
| 5,345,107 A | 9/1994 | Daikoku et al. | |
| 5,521,439 A | 5/1996 | Casati et al. | |
| 5,589,711 A * | 12/1996 | Sano et al. ................. | 257/718 |
| 5,784,257 A | 7/1998 | Tata | |
| 5,932,925 A | 8/1999 | McIntyre | |
| 5,933,325 A * | 8/1999 | Hou ........................... | 257/719 |
| 5,969,949 A * | 10/1999 | Kim et al. .................. | 361/704 |
| 5,969,950 A * | 10/1999 | Tantoush .................... | 361/704 |
| 6,209,623 B1 * | 4/2001 | Tantoush .................... | 361/704 |
| 6,212,074 B1 | 4/2001 | Gonsalves et al. | |
| 6,293,331 B1 * | 9/2001 | Wang ......................... | 165/80.3 |
| 6,318,451 B1 * | 11/2001 | Lee et al. ................... | 165/80.3 |

OTHER PUBLICATIONS

Emulation Technology—Snap-on BGA Heatsinks; pp. 1-3.
The news and products Journal for the Electronics Industry; "Canadian Electronics"; vol. 17, No. 3; May 2002.

\* cited by examiner

*Primary Examiner*—Michael Datskovsky
*Assistant Examiner*—Robert J. Hoffberg
(74) *Attorney, Agent, or Firm*—McGrath, Geissler, Olds & Richardson, PLLC

(57) ABSTRACT

A heatsink assembly is disclosed that includes a holder slidably engaging a circuit board component to be cooled and a heatsink secured to the heatsink holder. A method of cooling a circuit board component is also disclosed that involves the steps of providing a bracket having a central portion and first and second end portions directed toward one another, sliding the bracket over a portion of a circuit board component to be cooled such that the central portion faces a first surface of the circuit board component and the first and second end portions face opposing edges of the circuit board component, providing a heatsink, and securing the heatsink to the bracket in a manner that retains the heatsink and bracket on the circuit board component.

13 Claims, 8 Drawing Sheets

HEATSINK ASSEMBLY

CROSS-REFERENCE TO RELATED APPLICATIONS

The present application claims the benefit of U.S. Provisional Patent Application No. 60/524,040, filed Nov. 24, 2003, the entire contents of which are hereby incorporated by reference.

FIELD OF THE INVENTION

The present invention is directed toward a heatsink assembly and a method of cooling a component, and, more specifically, toward a heatsink assembly including a holder that mechanically engages a component to be cooled, a heatsink secured to the holder, and a method of cooling a component.

BACKGROUND OF THE INVENTION

Dissipation of excess heat is a problem that must often be addressed by equipment designers. Various electronic components, microprocessors, for example, need to be cooled in order to operate properly. As increasingly large numbers of components are formed in small areas, problems caused by excess heat become more pronounced. Various methods and devices have therefore been developed to cool components.

A popular method for dissipating heat is convection dissipation, especially via cooling fans in the vicinity of components to be cooled. In this method, moving air carries thermal energy from the heated component and dissipates it to the surrounding atmosphere. While this is sufficient for many purposes, it has been found that fan cooling alone is often insufficient.

Another common method of heat dissipation uses a combination of cooling by conduction and by radiation. Devices, known as heatsinks are mounted in direct contact with components to be cooled so that the thermal energy may be conducted, in accordance with equilibrium principles, from the component to the heatsink device. Most heatsinks have a substantial surface area that is not in contact with the component so that the absorbed thermal energy can dissipate into the air. Many heatsink devices include dissipation fins of various configurations, while others rely principally on a substantial heatsink mass to absorb heat, especially transient heat.

Heatsinks are sometimes secured to the top surface of electronic components by wires, clips, or the like. These wires or clips may snap over the heatsink to engage either the electronic device package or the socket into which the electronic device package is installed. Alternately, a heatsink may be connected to either the electronic component or the circuit board on which the component is mounted using screws or similar connectors. In addition, some heatsinks may be chemically bonded to the electronic component to be cooled; however, over time chemical bonds tend to break, resulting in decreased thermal conduction from the component to the heatsink. In extreme cases, the chemically bonded heatsink may detach completely from the component to be cooled.

Heatsinks that attach to electronic components or to surrounding circuit boards often require the use of mounting holes in either the component or the surrounding circuit board which complicates the installation process. Moreover connecting a heatsink to a circuit board can sometimes stress or damage the electronic connections between the circuit component and the circuit board, especially in the case of ball grid array (BGA) mounted components. It is therefore desirable to provide a heatsink that mounts to an electronic component in a manner unlikely to damage the electronic component and that does not necessarily require mounting holes in either the electronic component or the circuit board on which it is mounted.

SUMMARY OF THE INVENTION

These problems and others are addressed by the present invention which comprises, in a first embodiment, a heatsink assembly comprising a holder slidably engaging a circuit board component to be cooled and a heatsink secured to the heatsink holder.

Another aspect of the present invention comprises a heatsink assembly comprising a holder slidably engaging a circuit board component to be cooled and a heatsink secured to the heatsink holder, where the holder comprises a planar, bar shaped central portion having a first side and a second side, a first leg and a second leg depending from the first side, a first tab projecting from the first leg and a second tab projecting from the second leg toward the first leg, and a boss projecting from the second side. The holder is used with a heatsink that includes a first side having projections for increasing the surface area of the heatsink and a second side, the second side including a depression adapted to receive a portion of the component to be cooled and a bore receiving the holder boss. A fastener extends through an opening in the heatsink first side and into the boss to secure the heatsink to the holder.

An additional aspect of the invention comprises a heatsink assembly made up of a heatsink device for dissipating heat and a retaining device connected to the heatsink device for mechanically securing the heatsink device to a circuit board component to be cooled.

A further aspect of the invention comprises a heatsink assembly that includes a holder comprising first and second spaced channels for receiving first and second opposing portions of a circuit board mounted component to be cooled, a heatsink having a first side including a depression for receiving a portion of the circuit board mounted component to be cooled and a portion of the holder, and a connector connecting the heatsink to the holder.

Another aspect of the invention comprises a method of cooling a circuit board component that involves providing a bracket having a central portion and first and second end portions directed toward one another and sliding the bracket over a portion of a circuit board component to be cooled. The bracket slides over the component so that the central portion faces a first surface of the circuit board component and the first and second end portions face opposing edges of the circuit board component. A heatsink is then secured to the bracket in a manner that retains the heatsink and bracket on the circuit board component.

An additional aspect of the invention comprises a method of cooling a circuit board component that involves providing a circuit board component having a top surface lying in a first plane, connecting a holder to the circuit board component in a manner that allows the holder to slide in a second plane substantially parallel to the first plane, and fixing a heatsink to the holder in a manner that fixes the holder in a first position with respect to the circuit board component.

BRIEF DESCRIPTION OF THE DRAWINGS

These aspects of the invention and others will be better appreciated after a reading of the detailed description that appears below in connection with the following drawings wherein.

DETAILED DESCRIPTION

Figure 1:
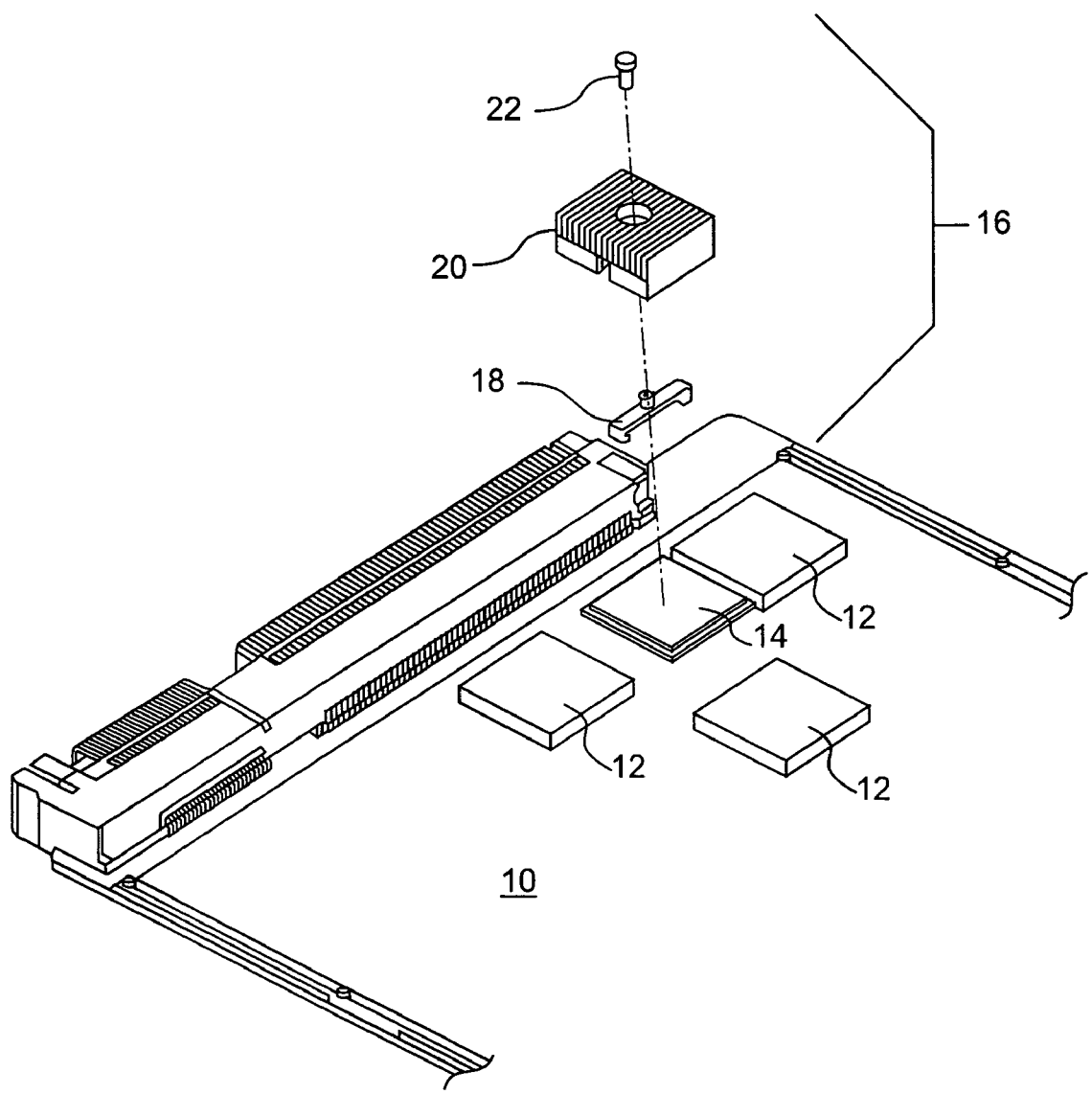
FIG. 1 is a partially exploded perspective view of a circuit board including an component to be cooled and a heat sink assembly including a heat sink and a holder according to a first embodiment of the present invention.

Referring now to the drawings, wherein the showings are for the purpose of illustrating preferred embodiments of the invention only, and not for the purpose of limiting same, FIG. 1 illustrates a circuit board 10 having a plurality of devices 12 mounted thereon including a component 14, such as a microprocessor, that requires cooling. A heatsink assembly 16, comprising a holder 18, a heatsink 20 and a fastener 22, described in detail hereinafter, attaches to component 14 to cool component 14 by a combination of conduction and convection.

As used herein, directional terms such as "upper" and "lower" will refer to components arranged and positioned as viewed in FIG. 1, that is with circuit board 10 forming a horizontal support and the remaining elements positioned thereabove, it being understood that the circuit board could be oriented vertically, at an angle to the horizontal or even upside down, without affecting the operation of heatsink 16.

Figure 2:
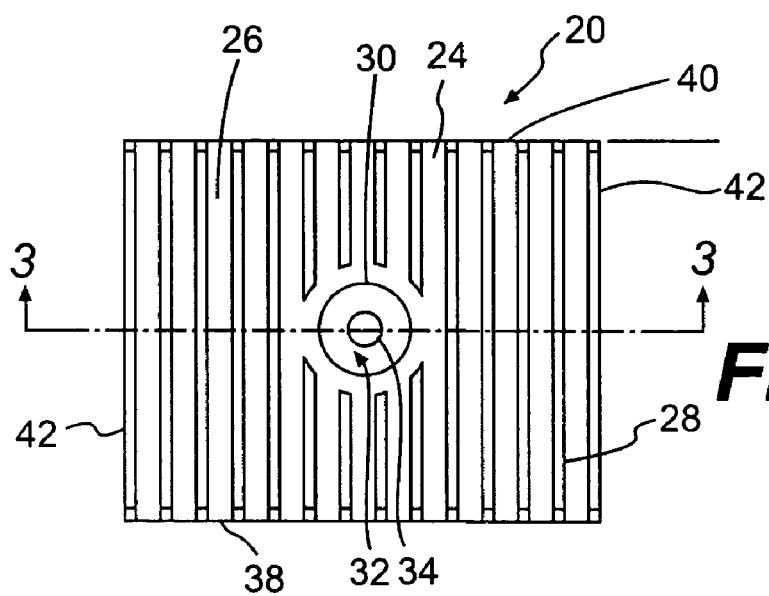
FIG. 2 is a top plan view of the heat sink of FIG. 1.
Figure 3:
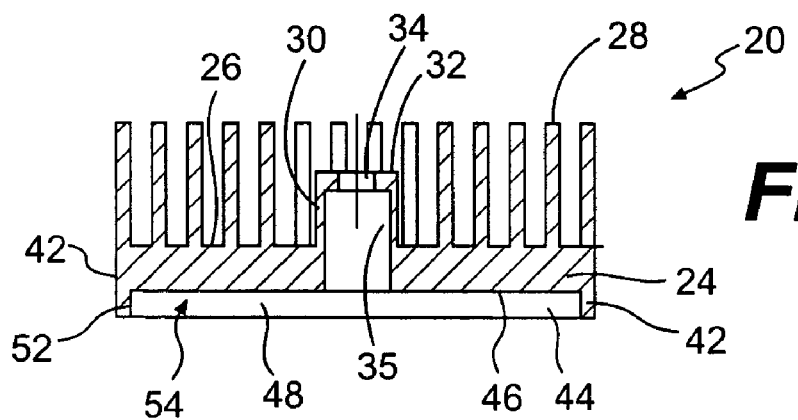
FIG. 3 is a sectional side elevational view taken along line 3—3 in FIG. 2.
Figure 4:
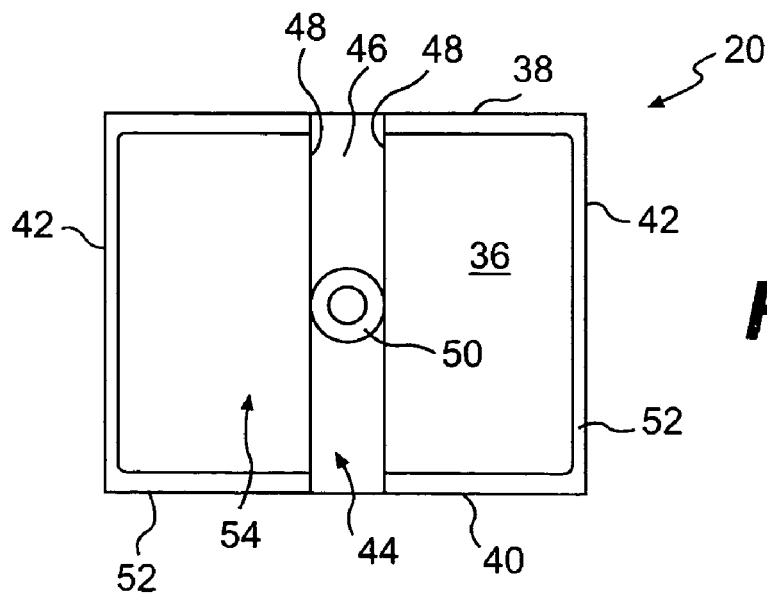
FIG. 4 is a bottom plan view of the heat sink of FIG. 1.

FIGS. 2 through 4 illustrate heatsink 20 in greater detail. Heatsink 20 includes a body 24 formed from a material with a high heat conductivity such as copper or aluminum. Aluminum is generally preferred for its lighter weight and lower cost, although copper conducts heat somewhat better. Body 24 includes a first, or top side 26 having a plurality of cooling fins 28 projecting therefrom and a raised, centrally disposed, cylindrical platform 30 having a top wall 32 with a through opening 34 leading to a hollow interior 35. Body 24 further includes a second, or bottom side 36, a front face 38, a rear face 40, first and second side faces 42 connecting front face 38 and rear face 40 and a channel 44 in bottom side 36 running between front face 38 and rear face 40 about midway between first and second side faces 42. Channel 44 includes an inner wall 46 and first and second side walls 48 and further includes a cylindrical bore 50 in inner wall 46 that extends into the interior 35 of cylindrical platform 30. Bottom side 36 is substantially surrounded by a flange 52 depending from side faces 42 and front and rear faces 38, 40 except at the locations where channel 44 meets the front and rear faces, the flange defining a region 54 that may be referred to hereinafter as a depression 54.

Figure 5:
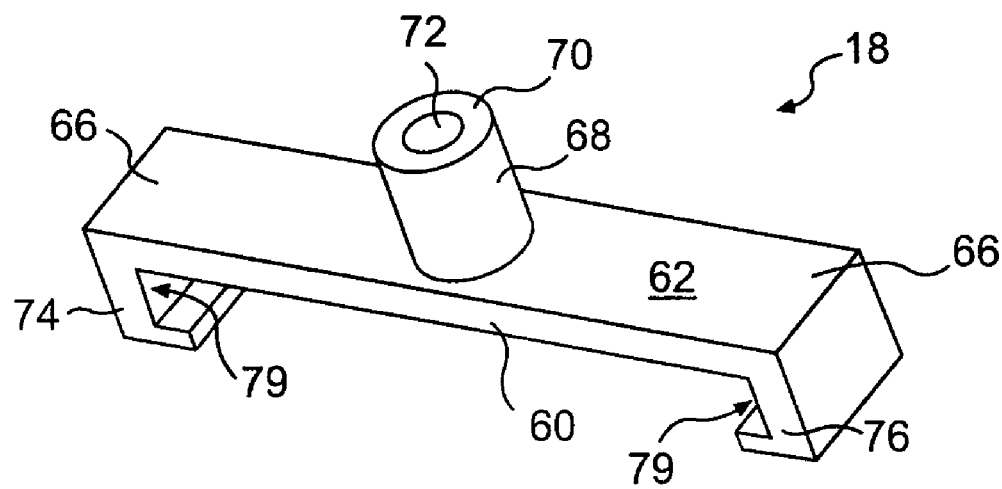
FIG. 5 is a perspective view of the holder of FIG. 1.
Figure 6:
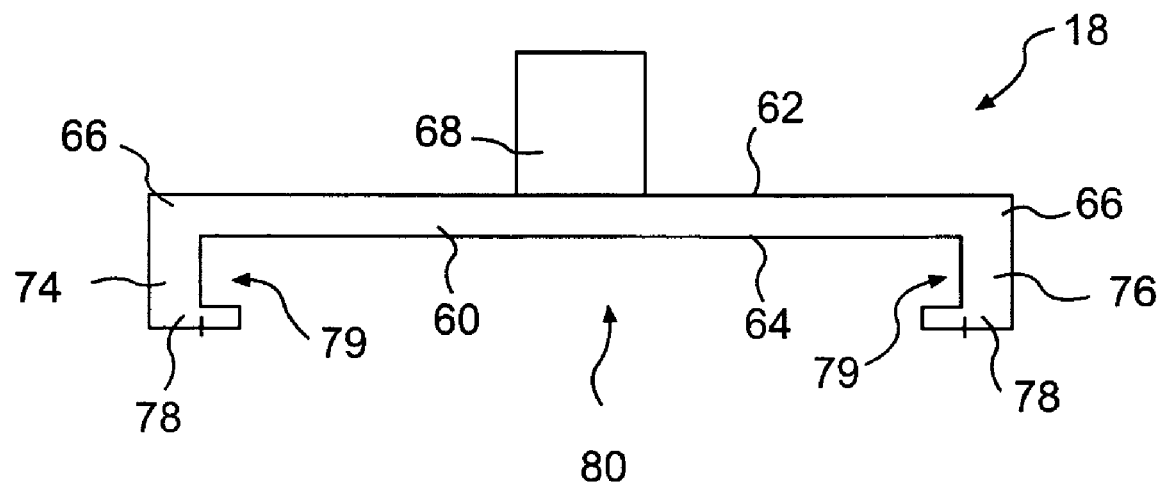
FIG. 6 is a side elevational view of the holder of FIG. 1.

FIGS. 5 and 6 illustrate holder 18 which comprises a bar-shaped body portion 60 having a top side 62, a bottom side 64 and first and second ends 66. A cylindrical boss 68 projects from a central portion of top side 62 and includes a top wall 70 having a threaded bore 72. First and second legs 74, 76 extend from first and second ends 66, and each leg includes a tab 78 projecting inwardly with respect to body portion 60, that is, the tab 78 formed on first leg 74 projects toward second leg 76 and the tab 78 on second leg 76 projects toward first leg 74. Tabs 78, first and second legs 74, 76 and bottom side 64 define two channels 79 which together define a slot 80 having a generally rectangular cross section for receiving an object such as a substrate or holder for a chip as discussed hereinafter.

Figure 7:
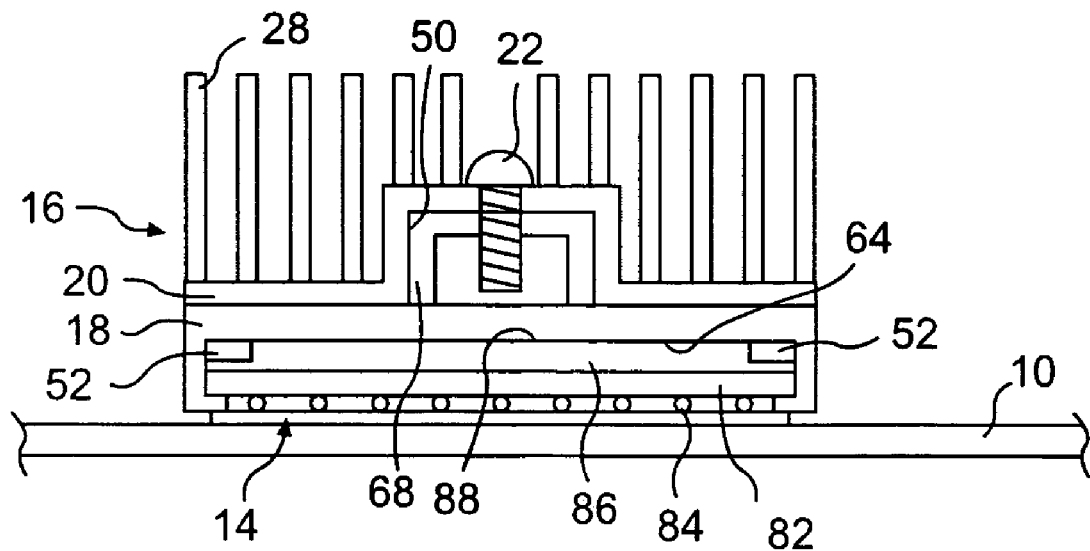
FIG. 7 is a sectional side elevational view of the heatsink assembly of FIG. 1 mounted to a first type of circuit board component.

FIG. 7 shows holder 18, heatsink 20 and fastener 22, in this case a screw, assembled and attached to an component 14 to be cooled. Component 14 comprises a substrate 82 which includes solder balls 84 forming a ball grid array for attachment to a suitable socket 84 in circuit board 10, and a chip 86 having a top surface 88 mounted on substrate 82. Chip 86, substrate 82 and solder balls 84 are sometimes referred to as a BGA package or BGA device. As will be appreciated from FIG. 8, holder 18 is configured so that slot 80 receives opposing sides of substrate 82 to allow holder 18 to slide over the BGA device. Tabs 78 extend under the substrate 82 to secure the holder 18 against removal in a direction normal to top surface 88 of the chip 86 while allowing the holder 18 to slide with respect to the chip 86. Preferably, the length of legs 74 and 76 is selected such that bottom 64 of holder 18 engages top surface 88 of chip 86 or rests on a thin layer of thermal compound 98 (shown in FIG. 14b) that may be applied over top surface 88 in a well known manner to improve heat transfer from the chip 86 to the heatsink assembly 16.

Heat sink 20 is mounted on holder 18 so that boss 68 of holder 18 is received in cylindrical bore 50 in channel inner wall 46 and projects into the interior 35 of cylindrical platform 30. The height of channel side walls 48, illustrated in FIG. 3, is selected to be greater than or equal to the thickness of holder body 60 so that the bottom 36 of the heatsink 20 rests on top surface 88 of chip 86 (or on a layer of thermal compound applied thereto) when the heatsink assembly 16 is attached. Opening 34 in top wall 32 of cylindrical platform 30 aligns with threaded bore 72 in top wall 70 of boss 68 so that fastener 22, when inserted through opening 34 and into bore 72 can be tightened to secure heatsink 20 to holder 18. Flange 52 extends over the edges of chip 86 to provide additional contact area between the heatsink 20 and the chip 86, and depression 54 receives the top portion of chip 86.

Heatsink 20 could be secured to holder 18 using other fasteners, such as clips or snaps, or by partially melting the material of the heatsink 20 to bond it to the holder; however, the use of a fastener 22 such as a screw provides for simple and inexpensive installation while also allowing the heatsink to be removed and reused if desired. Beneficially, the use of a fastener 22 such as a screw also allows the contact pressure of heatsink 20 on top surface 88 of chip 86 to be adjusted— tightening screw 22 increases the pressure exerted by heatsink 20 on top surface 88 thereby improving the thermal connection between these elements. And, since the fastener 22 is centrally disposed in the present embodiment, contact pressure is applied substantially evenly by heatsink 20 across top surface 88 of chip 86 and is not concentrated at, for example, the corners of the chip 86 as may occur when using conventional heatsink clips.

Moreover, this mechanical connection between the heatsink 20 and chip 86 will not release on its own and is unlikely to fail, unlike some chemical adhesives, and furthermore, does not require the provision of mounting holes in the circuit board. Attaching a heatsink to the BGA device directly also avoids stressing the solder connections between the BGA device and the circuit board.

Figure 8:
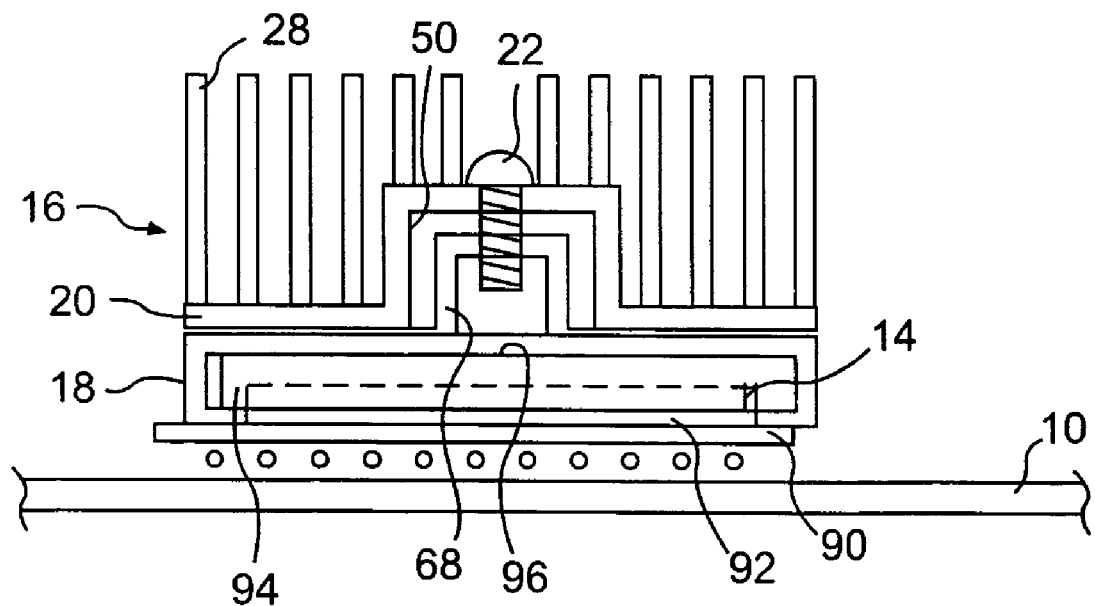
FIG. 8 is a sectional side elevational view of the heatsink assembly of FIG. 1 mounted to a second type of circuit board component.

FIG. 8 shows the heatsink assembly 16 of FIGS. 1–6 mounted on a second type of BGA device. Like the first type of BGA device illustrated in FIG. 7, the second type of device of FIG. 8 includes a substrate 90 and a chip 92 and, in addition, includes a chip cover 94. Heatsink assembly 16 can be attached to the substrate 90 of this second type of BGA device in the same manner described above. Alternately, and as illustrated in FIG. 8, it can be also be attached to chip cover 94 so that tabs 78 are received in a gap between chip cover 94 and chip substrate 90. In fact, heatsink assembly 16 could be mounted to substantially any component that requires cooling as long as opposed slots, such as the ones formed by the gap between chip cover 94 and substrate 90 or the gap between substrate 82 and circuit board 10 are present in either the component to be cooled, a support for the component to be cooled, or a combination of both, without exceeding the scope of the claimed invention.

Figure 9:
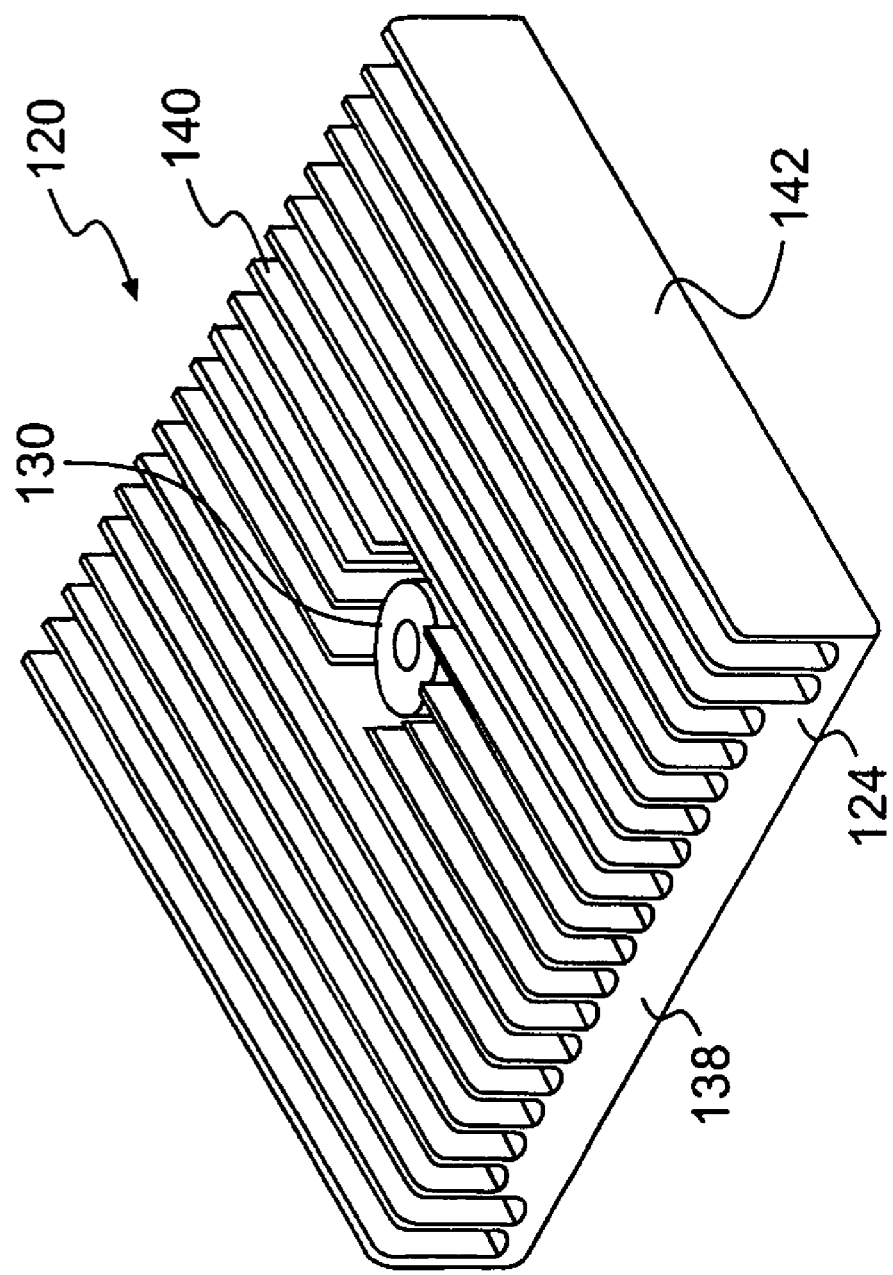
FIG. 9 is perspective view of a heat sink according to a second embodiment of the present invention.
Figure 12:
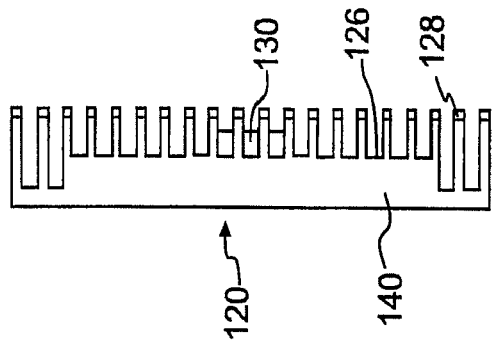
FIG. 12 is a side elevational view of the heat sink of FIG. 9 taken in the direction of line 12—12 in FIG. 10.
Figure 10:
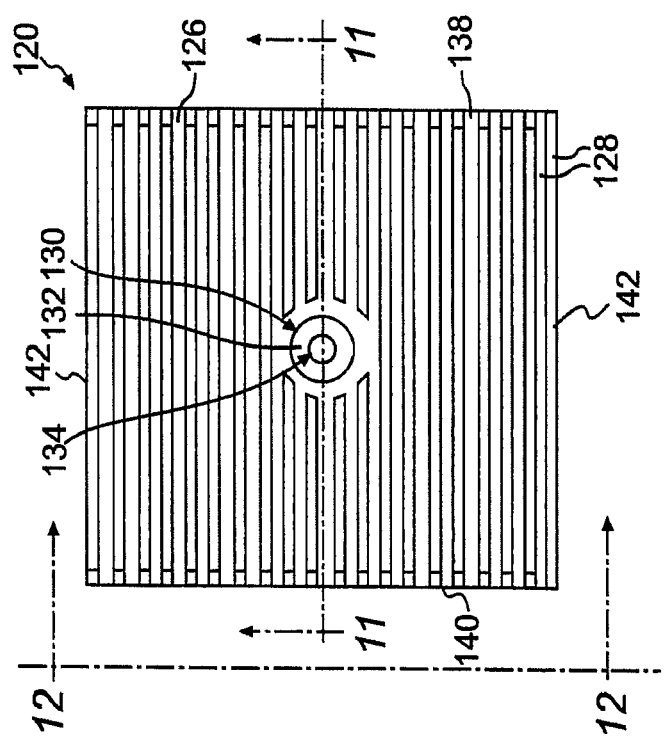
FIG. 10 is a top plan view of the heat sink of FIG. 9.
Figure 11:
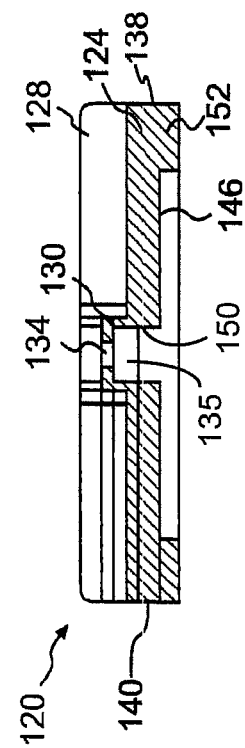
FIG. 11 is a sectional side elevational view taken along line 11—11 in FIG. 10.
Figure 13:
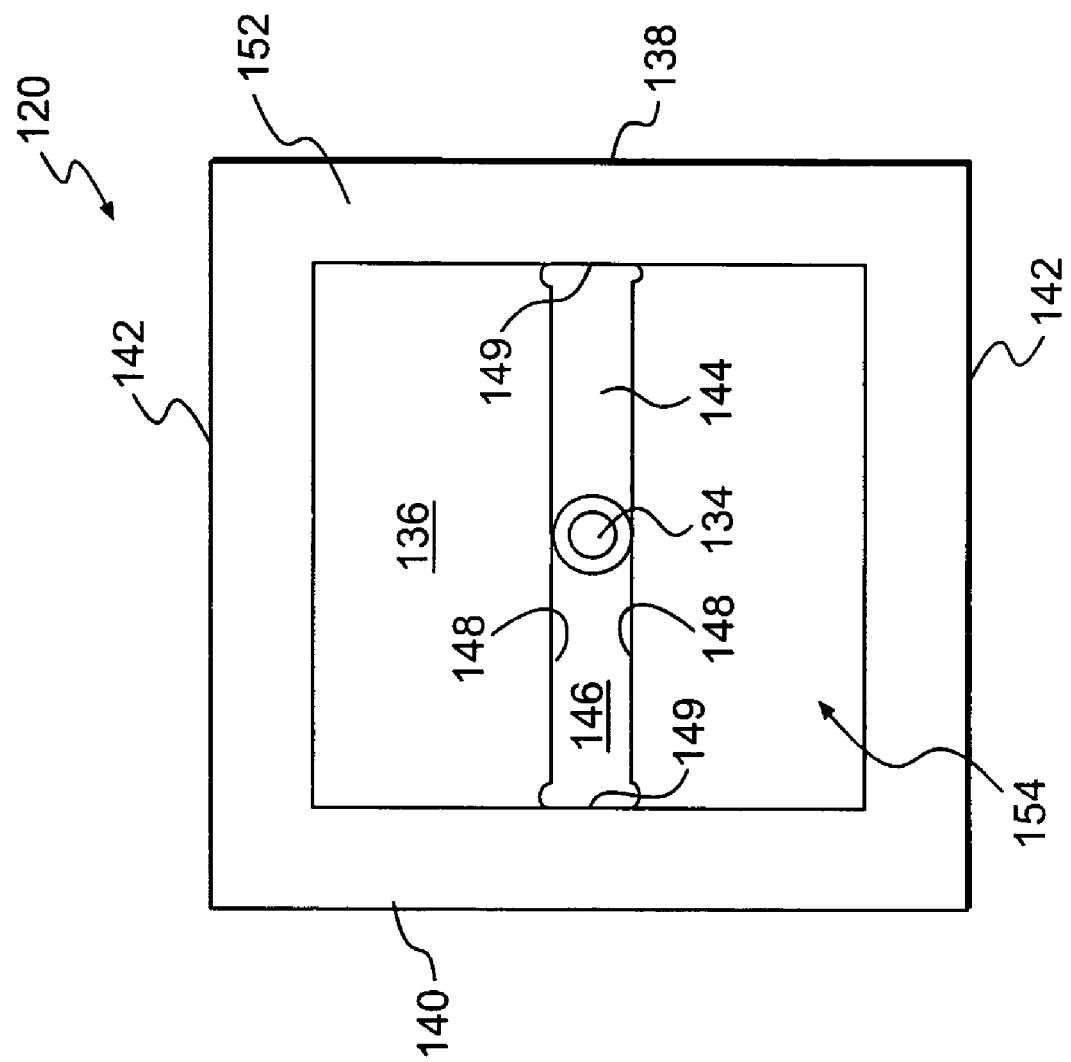
FIG. 13 is a bottom plan view of the heat sink of FIG. 9.

A second embodiment of the present invention is disclosed in FIGS. 9 through 13, wherein the same reference numerals are used to identify elements common to both embodiments. FIG. 9 is a perspective view of a heatsink 120 having a body 124, formed from a material with a high degree of heat conductivity such as copper or aluminum. Body 124 includes a first, or top side 126 having a plurality of cooling fins 128 projecting therefrom and a raised, centrally disposed, cylindrical platform 130 having a top wall 132 with a through opening 134 that leads to a hollow interior 135.

Body 124 further includes a second, or bottom side 136, a front face 138, a rear face 140, first and second side faces 142 connecting front face 138 and rear face 140 and a channel 144 in the bottom side 136 extending across bottom side 136 between but stopping short of first and second side faces 142. Channel 144 includes an inner wall 146 and first and second side walls 148 and first and second end walls 149. Channel 144 further includes a cylindrical bore 150 in inner wall 146 that extends into the interior 135 of circumferential platform 130.

Bottom side 136 is completely surrounded by a flange 152 depending from side faces 142 and front and rear faces 138, 140, the flange 152 defining a region 154 that may be referred to hereinafter as a depression 154. In this embodiment, holder 18 is received within heatsink 120; legs 74, 76 are not exposed when heatsink 120 is mounted on holder 18. This differs from heatsink 20 which includes openings in the front and rear faces 38, 40 that expose legs 74, 76. This second embodiment of a heatsink assembly allows for the provision of a heatsink larger that the circuit board component to be cooled, which may be desirable when a large amount of cooling is required.

Figure 14A:
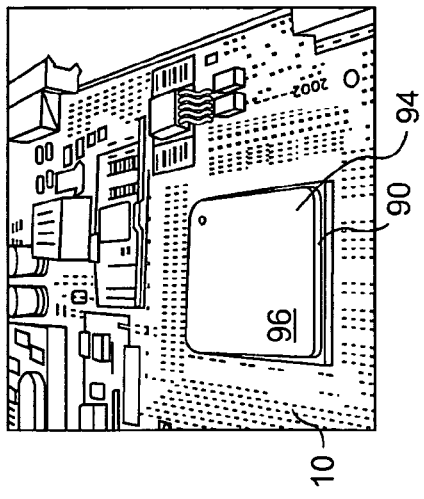
FIGS. 14a–14f illustrate a method of attaching the heat sink assembly of the second embodiment of the present invention to the circuit board component shown in FIG. 8.

A method of attaching the heatsink 120 to the second type of BGA device will now be described with reference to FIGS. 14a–14f. FIG. 14a illustrates a BGA package including a substrate 90 and chip cover 94 (covering a chip 92 seen only in FIG. 8) mounted on a circuit board 10.

Figure 14B:
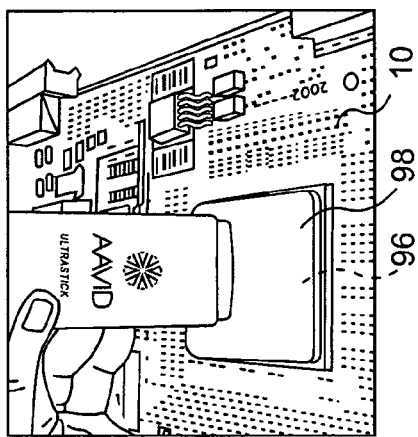

FIG. 14b illustrates the application of an optional layer of thermal compound 98 to the top surface 96 of chip cover 94. The thermal compound helps to fill small gaps between the heatsink and the component to be cooled and improves the transmission of thermal energy from the component to the heatsink. Such thermal compounds are useful when an component to be cooled has a metal chip cover as shown in this embodiment and are even more useful to improve heat conduction when no metal cover is present; this is because thermal conduction from the metal chip cover to a metal heatsink is generally better that thermal conduction between a ceramic chip and a metal heatsink. Many thermal compounds comprise, for example, a mixture of silicone and zinc oxide; however, the present invention is not limited to the use of any particular thermal compound. As these compounds are well known in the art and commonly available, they will not be described further herein.

Figure 14C:
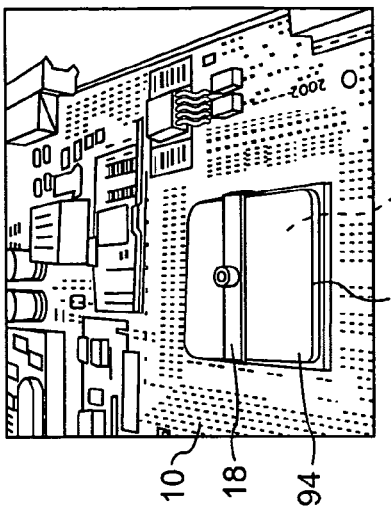
Figure 14D:
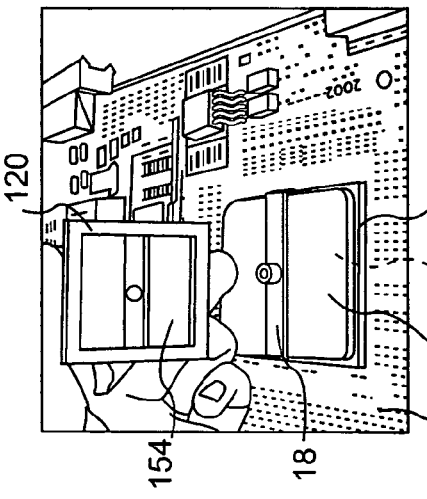
Figure 14E:
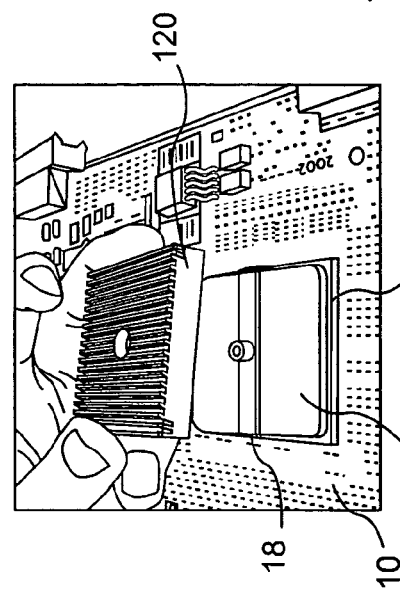
Figure 14F:
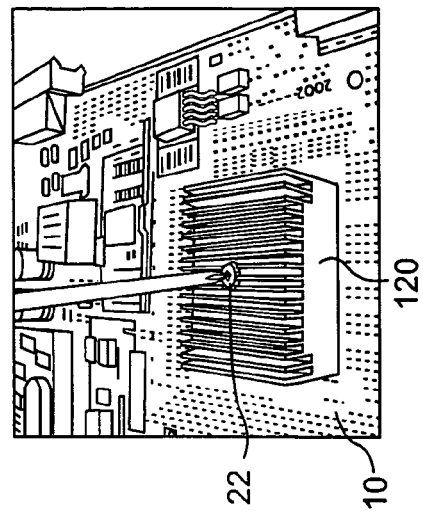

In FIG. 14c, holder 18 has been slid over chip cover 94 so that tabs 78 are received in the gap between chip cover 94 and substrate 90 in the manner illustrated in FIG. 8. Holder 18 is thus substantially fixed against movement normal to top surface 96 of the chip cover but is free to move in a plane parallel to the top surface. Once properly positioned in the center of chip cover 94, as seen in FIGS. 14d and 14e, heatsink 120 is placed over holder 18 and chip cover 94 so that boss 68 of holder 18 is received into the interior 135 of cylindrical platform 130 of the heatsink 20, body 60 is received in channel 144, and part or all of chip cover 94 is received in depression 154. Fastener 22 is then placed through the aligned openings in the heatsink 120 and holder 18 as previously described and tightened, as illustrated in FIG. 14f, to firmly secure heatsink 120 to chip cover 120 with bottom side 136 of heatsink 120 in good thermal contact with the top 96 of chip cover 94 via the layer of thermal compound 98.

As will be apparent from the foregoing description, neither holder 18 nor heatsink 120 is directly connected to the BGA device. Rather, holder 18 remains free to slide relative to the surface of chip cover 94 until heatsink 120 is connected thereto. Fastener 22 secures the heatsink 120 to the holder 18 and prevents the heatsink from being moved away from the component to be cooled. Once the top of chip cover 94 is received in depression 154, and the heatsink 120 is connected to the holder 18, neither heatsink 120 nor holder 18 is free to move parallel to the surface of chip cover 94. Thus, a method of fixing a heatsink to a component is disclosed in which the only fastener used holds a heatsink to a holder.

The invention has been described herein in terms of several embodiments; however, obvious modifications and additions to these embodiments will become apparent to those skilled in the relevant arts upon a reading of the foregoing description. It is intended that all such obvious modifications and additions form a part of the present invention to the extent that they fall within the scope of the several claims appended hereto.

I claim:
1. A heatsink assembly comprising:
   a holder slidably engaging a circuit board component to be cooled; and
   a heatsink secured to the heatsink holder, wherein said heatsink includes a first side having projections for increasing the surface area of the heatsink and a second side, said second side including a depression adapted to receive a portion of the component to be cooled.

2. The heatsink assembly of claim 1 wherein said heatsink is mechanically secured to said heatsink holder.

3. The heatsink assembly of claim 2 wherein said heatsink is releasably secured to said heatsink holder.

4. The heatsink assembly of claim 1 wherein said heatsink is releasably secured to said heatsink holder.

5. The heatsink assembly of claim 1 wherein said holder comprises a central portion, a first end, a first tab projecting from said first end, a second end, and a second tab projecting from said second end toward said first tab.

6. The heatsink assembly of claim 1 wherein:
said holder comprises a planar, bar shaped central portion having a first side and a second side, a first leg and a second leg depending from said first side, a first tab projecting from said first leg and a second tab projecting from said second leg toward said first leg, and a boss projecting from said second side;
said heatsink includes a bore receiving said boss; and
a fastener extending through an opening in said heatsink first side and into said boss.

7. The heatsink assembly of claim 1 wherein the circuit board component comprises a BGA component.

8. A heatsink assembly comprising:
a holder slidably engaging a circuit board component to be cooled; and
a heatsink secured to the heatsink holder, wherein said holder comprises a planar, bar shaped central portion having a first side and a second side, a first leg and a second leg depending from said first side, a first tab projecting from said first leg and a second tab projecting from said second leg toward said first leg, and a boss projecting from said second side, and wherein said heatsink include a bore adapted to receive said boss.

9. The heatsink assembly of claim 8 including a fastener securing said heatsink to said boss.

10. A heatsink assembly comprising:
a holder slidably engaging a circuit board component to be cooled; and
a heatsink secured to the heatsink holder, wherein said heatsink includes a first side having projections for increasing the surface area of the heatsink and a second side opposite said first side, said second side including first and second spaced projections adapted to cover opposing portions of the component to be cooled.

11. The heatsink assembly of claim 10 including a layer of thermal compound on said heatsink second side.

12. A heatsink assembly comprising:
a holder slidably engaging a circuit board component to be cooled; and
a heatsink secured to the heatsink holder, wherein said holder comprises a central portion and first and second end portions defining first and second spaced channels for receiving opposed first and second portions of the component to be cooled and wherein said heatsink includes a first side having projections for increasing the surface area of the heatsink and a second side, said second side including first and second spaced projections adapted to engage third and fourth opposed portions of the component to be cooled.

13. A heatsink assembly comprising:
a holder comprising first and second spaced channels for receiving first and second opposing portions of a circuit board mounted component to be cooled;
a heatsink having a first side including a depression for receiving a portion of the circuit board mounted component to be cooled and a portion of said holder; and
a connector connecting said heatsink to said holder.

* * * * *